United States Patent
Weng et al.

(10) Patent No.: US 9,768,022 B2
(45) Date of Patent: Sep. 19, 2017

(54) ADVANCED CROSS-LINKABLE LAYER OVER A SUBSTRATE

(71) Applicant: Taiwan Semiconductor Manufacturing Co., Ltd., Hsin-Chu (TW)

(72) Inventors: Ming-Huei Weng, New Taipei (TW); Chen-Yu Liu, Kaohsiung (TW); Ching-Yu Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/007,825

(22) Filed: Jan. 27, 2016

(65) Prior Publication Data

US 2017/0213722 A1    Jul. 27, 2017

(51) Int. Cl.
| | |
|---|---|
| G03F 7/40 | (2006.01) |
| H01L 21/027 | (2006.01) |
| H01L 21/033 | (2006.01) |
| G03F 7/09 | (2006.01) |
| G03F 7/11 | (2006.01) |
| G03F 7/30 | (2006.01) |
| G03F 7/32 | (2006.01) |
| G03F 7/039 | (2006.01) |

(52) U.S. Cl.
CPC .......... *H01L 21/0273* (2013.01); *G03F 7/039* (2013.01); *G03F 7/091* (2013.01); *G03F 7/11* (2013.01); *G03F 7/30* (2013.01); *G03F 7/322* (2013.01); *H01L 21/0332* (2013.01)

(58) Field of Classification Search
CPC . G03F 7/11; G03F 7/039; G03F 7/091; G03F 7/094; G03F 7/30; G03F 7/322; H01L 21/0332; H01L 21/0271; H01L 21/033; H01L 21/0276
USPC ....... 430/311, 322, 325, 329, 330, 331, 434, 430/435; 438/636
See application file for complete search history.

(56) References Cited

U.S. PATENT DOCUMENTS

| | | | |
|---|---|---|---|
| 8,216,767 B2 | 7/2012 | Wang et al. | |
| 8,323,870 B2 | 12/2012 | Lee et al. | |
| 8,580,117 B2 | 11/2013 | Kao et al. | |
| 8,658,344 B2 | 2/2014 | Wang et al. | |
| 8,715,919 B2 | 5/2014 | Chang et al. | |
| 8,741,551 B2 | 6/2014 | Wu et al. | |
| 2008/0171293 A1* | 7/2008 | Dunn | G03F 7/203 430/323 |
| 2009/0098490 A1* | 4/2009 | Pham | G03F 7/095 430/327 |

(Continued)

*Primary Examiner* — Amanda C Walke
(74) *Attorney, Agent, or Firm* — Haynes and Boone, LLP

(57) ABSTRACT

A lithography method is provided in accordance with some embodiments. The lithography method includes providing a substrate, forming a crosslinked layer over the substrate, wherein the crosslinked layer is in contact with the substrate, forming a patterned layer over the crosslinked layer, forming a pattern in the crosslinked layer and further in the substrate by using the patterned layer as a mask, treating the crosslinked layer by using a radiation source to transition the crosslinked layer to a de-crosslinked layer with a reduced molecular weight, and removing the de-crosslinked layer by using a solution that is not subject to cause damage on the substrate.

20 Claims, 11 Drawing Sheets

(56) References Cited

U.S. PATENT DOCUMENTS

| | | | |
|---|---|---|---|
| 2009/0226672 A1* | 9/2009 | Meador | G03F 7/039 |
| | | | 428/161 |
| 2009/0246958 A1* | 10/2009 | Burns | G03F 7/091 |
| | | | 438/694 |
| 2012/0034419 A1* | 2/2012 | Washburn | H01L 21/0332 |
| | | | 428/138 |
| 2012/0178029 A1* | 7/2012 | Huang | G03F 7/0392 |
| | | | 430/449 |
| 2013/0323641 A1 | 12/2013 | Chang | |
| 2014/0011133 A1 | 1/2014 | Liu et al. | |
| 2014/0017615 A1 | 1/2014 | Chang | |
| 2014/0017616 A1 | 1/2014 | Chang | |
| 2014/0065843 A1 | 3/2014 | Chang et al. | |
| 2014/0117563 A1 | 5/2014 | Yu et al. | |
| 2014/0120459 A1 | 5/2014 | Liu et al. | |
| 2014/0186773 A1 | 7/2014 | Chang | |
| 2014/0255850 A1 | 9/2014 | Chang et al. | |
| 2014/0272709 A1 | 9/2014 | Liu et al. | |
| 2014/0272726 A1 | 9/2014 | Chang | |
| 2014/0273521 A1 | 9/2014 | Wu et al. | |
| 2015/0050601 A1* | 2/2015 | Chen | G03F 7/30 |
| | | | 430/325 |
| 2015/0248056 A1* | 9/2015 | Shirakawa | G03F 7/11 |
| | | | 430/15 |

* cited by examiner

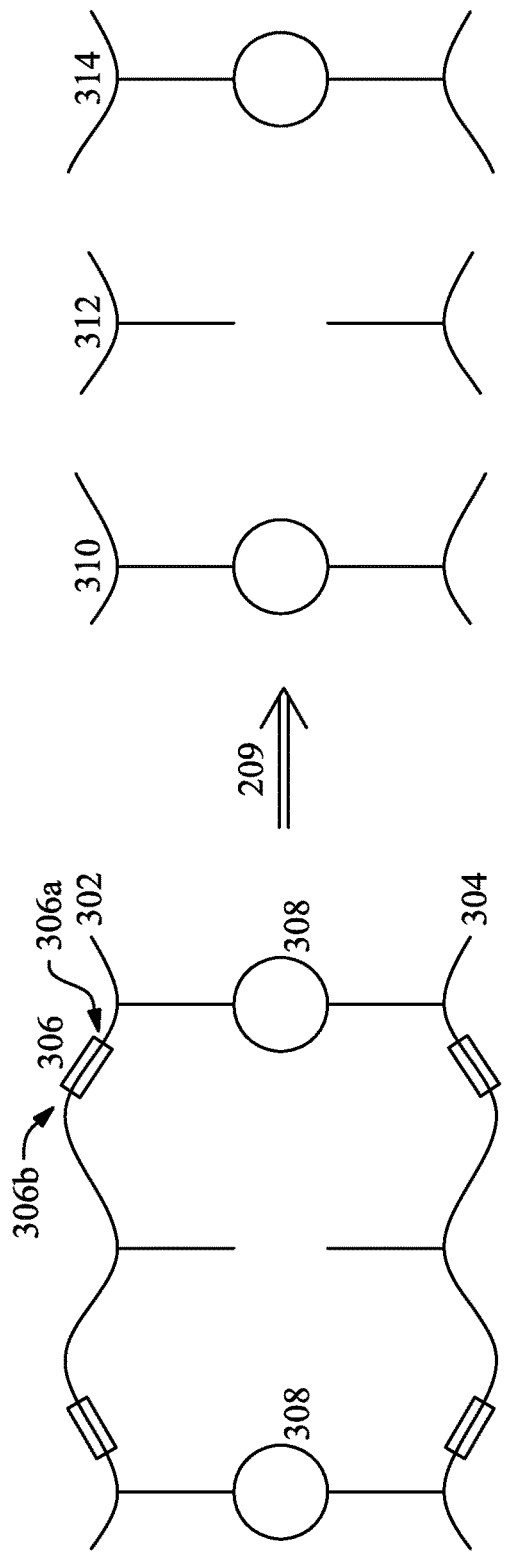

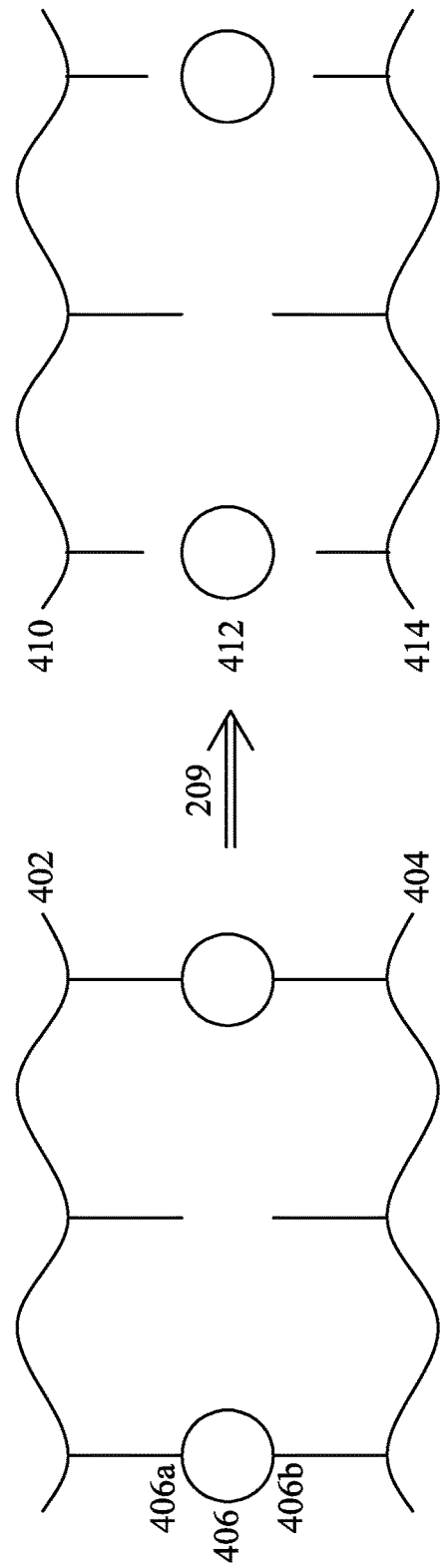

ADVANCED CROSS-LINKABLE LAYER OVER A SUBSTRATE

BACKGROUND

In integrated circuit (IC) fabrications, a patterned photoresist layer is used to transfer a designed pattern having small feature sizes from a photomask to a wafer. The photoresist is light-sensitive and can be patterned by a photolithography process. Furthermore, the photoresist layer provides resistance to etch or ion implantation, which further requires a sufficient thickness. When IC technologies are continually progressing to smaller feature sizes, for example, down to 32 nanometers, 28 nanometers, 20 nanometers and below, the thickness is not scaled down accordingly because of the resistance requirement. Depth of focus sufficient enough to cover the thicker photoresist degrades the imaging resolution. Multiple-film photoresist has been introduced to overcome the above challenge. However, while a variety of such multiple-film photoresists have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B respectively illustrates a schematic example of a crosslinked layer and a de-crosslinked layer in response to a treatment, constructed according to aspects of the present disclosure in some embodiments.

FIGS. 4A and 4B respectively illustrates a schematic example of a crosslinked layer and a de-crosslinked layer in response to a treatment, constructed according to aspects of the present disclosure in some embodiments.

DETAILED DESCRIPTION

Figure 1:
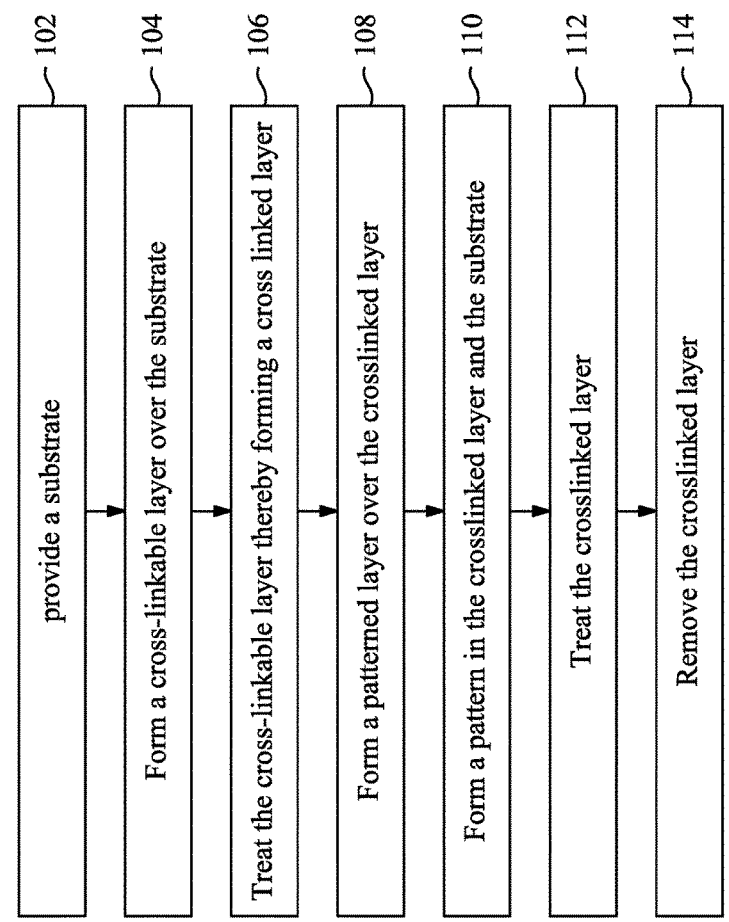
FIG. 1 illustrates a flowchart of a method for fabricating a semiconductor device using a crosslinked layer in accordance with various embodiments.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As lithographic features are reduced, for example, to below 40 nanometers (nm), high numerical aperture processes are needed to overcome the resolution limit. The use of a multiple-film photoresist (e.g., bilayer and/or trilayer photoresist stack) appears to be promising in this regard. Specifically, such a multiple-film photoresist generally includes a cross-linkable layer that is directly above and in contact with an overlaid substrate. The cross-linkable layer may serve as a protective layer for the overlaid substrate after being cross-linked. In an example, the cross-linkable layer generally includes a plurality of components (e.g., polymer chains), whereby each of the components is able to inter-connect with each other in response to a treatment. After such a treatment (i.e., the inter-connection of different polymer chains), the cross-linkable layer may become a cross-linked layer and the cross-linked layer may accordingly have a significantly increased molecular weight. Because of the increased molecular weight, the cross-linked layer may be thus configured to protect the overlaid substrate (e.g., preventing an intermix of a photoresist into the substrate especially during a heating and/or calcining process). Conventionally, a plasma etching (with high energy) and/or a strong solution (e.g., strong acid, base, oxidant) is used to remove such a cross-linked layer, which may result in damaging the overlaid substrate. Thus, the present disclosure provides methods to treat such a cross-linked layer thereby causing the cross-linked layer to be removed with a mild solution. As such, a substrate (or a layer) overlaid by the cross-linked layer may not be subject to damage caused by the conventional approaches.

FIG. 1 is a flow chart of a method 100 of patterning a substrate (e.g., a semiconductor wafer) according to various aspects of the present disclosure. The method 100 may be implemented, in whole or in part, by a system employing deep ultraviolet (DUV) lithography, extreme ultraviolet (EUV) lithography, electron beam (e-beam) lithography, x-ray lithography, and/or other lithography processes to improve pattern dimension accuracy. Additional operations can be provided before, during, and after the method 100, and some operations described can be replaced, eliminated, or moved around for additional embodiments of the method.

The method 100 is described below in conjunction with FIGS. 2A, 2B, 2C, 2D, 2E, 2F, 2G wherein a semiconductor device 200 is fabricated by using embodiments of the method 100. The semiconductor device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), fin-like FETs (FinFETs), other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 2A:
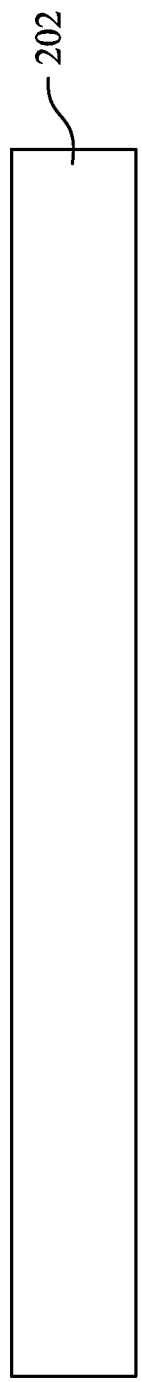
FIGS. 2A, 2B, 2C, 2D, 2E, 2F, and 2G illustrate sectional views of one exemplary semiconductor structure at various fabrication stages, constructed in accordance with some embodiments.

Referring now to FIG. 1 in conjunction with FIG. 2A, the method 100 begins with operation 102 in which a substrate 202 of a semiconductor device 200 is provided. The semiconductor device 200 is a semiconductor wafer in the present embodiment. The semiconductor device 200 includes a semiconductor substrate 202, such as a silicon substrate in some embodiments. The substrate 202 may include another elementary semiconductor, such as germanium, or diamond in some embodiments. The substrate 202 may include a compound semiconductor, such as silicon carbide, gallium arsenic, indium arsenide, and indium phosphide. The substrate 202 may include an alloy semiconductor, such as silicon germanium, silicon germanium carbide, gallium arsenic phosphide, and gallium indium phosphide. The substrate 202 may include one or more epitaxial semiconductor layer, such as semiconductor layer(s) epitaxially grown on a silicon substrate. For example, the substrate may have an epitaxial layer overlying a bulk semiconductor. Further, the substrate may be strained for performance enhancement. For example, the epitaxial layer may include semiconductor materials different from those of the bulk semiconductor such as a layer of silicon germanium overlying a bulk silicon, or a layer of silicon overlying a bulk silicon germanium formed by a process including selective epitaxial growth (SEG). Furthermore, the substrate 202 may include a semiconductor-on-insulator (SOI) structure. For examples, the substrate may include a buried oxide (BOX) layer formed by a process such as separation by implanted oxygen (SIMOX). In other embodiments, the substrate 202 may include a glass such as in thin film transistor (TFT) technologies.

Figure 2B:
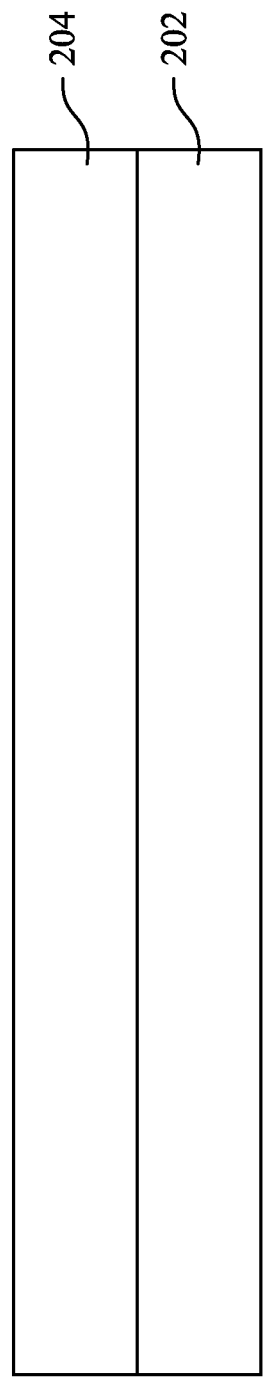

Referring now to FIG. 1 in association with FIG. 2B, the method 100 proceeds to operation 104 with forming a cross-linkable layer 204 over the substrate 202. The semiconductor device 200 may also include other material layers and other circuit patterns. For example, the semiconductor device 200 may include various doped features, such as doped well structure (e.g., a P-typed doped well and an N-type doped well) formed in the semiconductor substrate 202. In other embodiments, the semiconductor device 200 may further include one or more material layers to be patterned (by etching to remove or ion implantation to introduce dopants), such as a dielectric layer to be patterned to form trenches for conductive lines or holes for contacts or vias; a gate material stack to be patterned to form gates; and/or a semiconductor material to be patterned to form isolation trenches. In other embodiments, multiple semiconductor material layers, such as gallium arsenic (GaAs) and aluminum gallium arsenic (AlGaAs), are epitaxially grown on the semiconductor substrate and are patterned to form various devices, such as light-emitting diodes (LEDs). In some other embodiments, the semiconductor device 200 includes fin active regions and three dimensional fin field-effect transistors (FinFETs) formed or to be formed thereon.

Referring still to FIG. 2B, in some embodiments, the forming the cross-linkable layer 204 (i.e., operation 104) may include a spin-on coating process. Generally, the cross-linkable layer includes polymer(s), additive(s), solvent(s). In some embodiments, the additive may include a cross-link functional group (e.g., a hydroxyl group, an alkene group, an alkyne group, and/or an epoxide group) that is configured to provide a cross-linking bond for connecting a component (e.g., a polymer), a cross-linker (e.g., a homobifunctional/heterobifunctional cross-linker), a cross-linking catalyst, and/or a photo-cleavable cross-linker. Details of the cross-linkable layer will be discussed below.

Figure 2C:
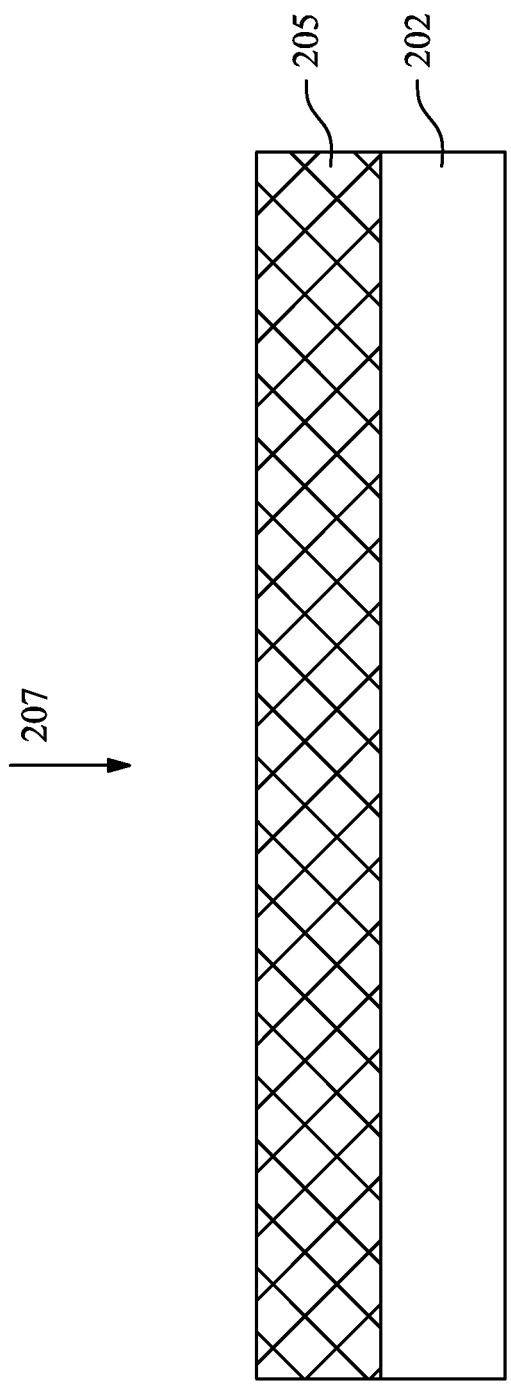

Referring now to FIG. 1 and in conjunction with FIG. 2C, the method 100 proceeds to operation 106 with treating (207) the cross-linkable layer 204 so as to form a cross-linked layer 205. In some embodiments, the treating 207 may include using an electromagnetic wave, a heating process, and/or a chemical reaction. In an example, the electromagnetic wave that may be used to cause the cross-linkable layer 204 to become the cross-linked layer 205 may include a radio wave, a microwave, an infrared light, a visible light, and/or an ultraviolet light. Moreover, the electromagnetic wave may be applied to the cross-linkable layer 204 directly for a duration that ranges between about 1 second and about 100 seconds. In another example, the heating process may include baking the substrate 202 at an elevated temperature (e.g., about 22° C. to about 400° C.). Yet in another example, the chemical reaction may include applying a chemical solution such as an acid, a base, an oxidant, a reductant, a nucleophile, and/or an electrophile, whereby an amount of the chemical solution being applied ranges between about 0.01% and about 30%.

Referring still to FIG. 2C, after the treatment 207, the cross-linked layer 205 may include a molecular weight that is significantly higher than a molecular weight of the cross-linkable layer 204 (i.e., before the treatment 207). For example, the molecular weight may change from 1,000 Daltons to 500,000 Daltons, from 1,000 Daltons to 200,000 Daltons, from 3,000 Daltons to 500,000 Daltons. As identified above, the significant increase of the molecular weight may advantageously prevent an inter-mix of any of a variety of layers disposed over the substrate into the substrate.

Figure 2D:
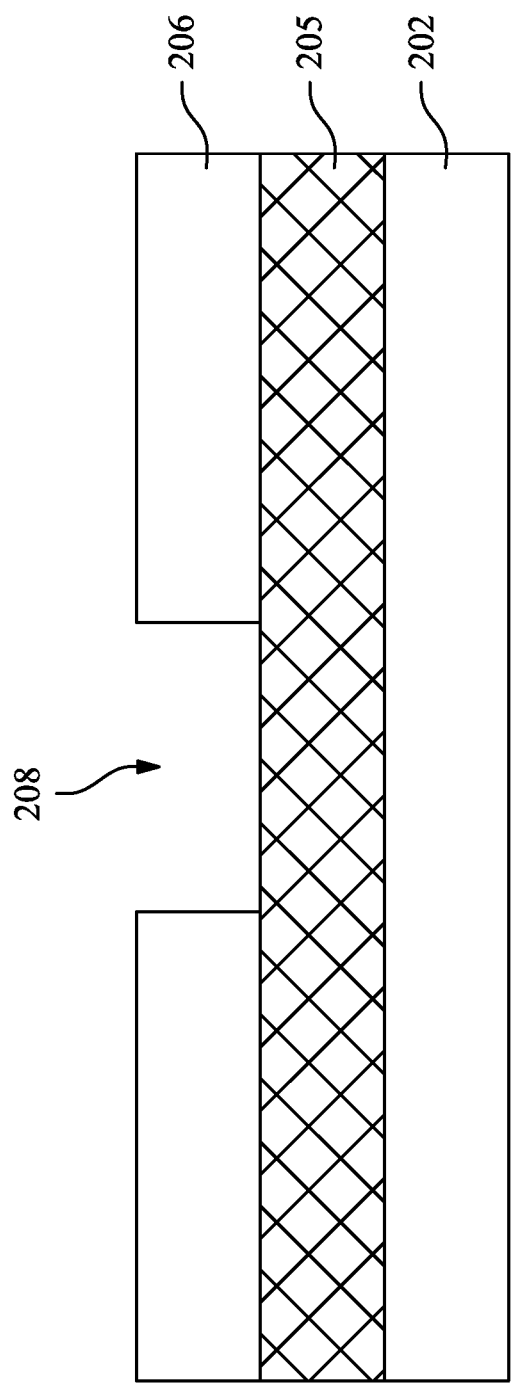

Referring back to FIG. 1, the method 100 continues to operation 108 with forming a patterned layer over the cross-linked layer 205, as illustrated in FIG. 2D. In an embodiment, the patterned layer 206 is formed by a plurality of processes that includes: spin-on coating a liquid polymeric material onto the cross-linked layer 205, a soft baking process, an exposure process, a post-exposure baking process, a developing process, and a hard baking process. In an embodiment, the patterned layer 206 is a radiation sensitive layer, such as a photoresist including an I-line resist, a DUV resist including a krypton fluoride (KrF) resist and argon fluoride (ArF) resist, a EUV resist, an electron beam (e-beam) resist, and an ion beam resist. Thus, the exposure process may include exposing a photoresist layer to a radiation beam with a mask in a lithography system so as to form the patterned layer 206 that includes a pattern (e.g., an opening 208 as illustrated in FIG. 2D). The radiation beam may be an I-line (365 nm), a DUV radiation such as KrF excimer laser (248 nm) or ArF excimer laser (193 nm), a EUV radiation (e.g., 13.5 nm), an e-beam, an x-ray, an ion beam, and/or other suitable radiations.

In some alternative embodiments, before forming the patterned layer 206 over the cross-linked layer 205, there may be a middle layer formed between the patterned layer 206 and the cross-linked layer 205. Specifically, the middle layer may be a hardmask layer. Such a hardmask layer may be a silicon-based hardmask layer or in some specific embodiments, the hardmask layer may be a metal-containing silicon-based hardmask layer.

Figure 2E:
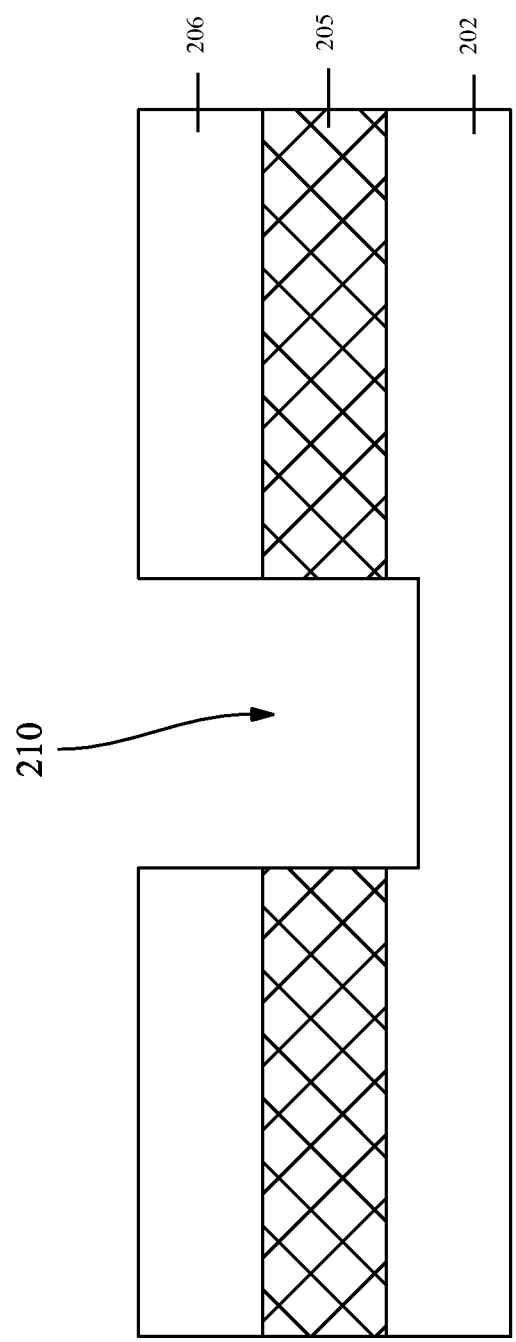

Referring now to FIG. 1 in conjunction with FIG. 2E, the method 100 proceeds to operation 110 with using the patterned layer 206 as a mask, forming a pattern 210 in the cross-linked layer 205 and in the substrate 202. The formation of the pattern 210 may include at least one or more of the following processes: a dry etching process, a wet etching process, and a developing process. In some embodiments, after the pattern 210 has been formed, the patterned layer 206 may be removed from the cross-linked layer 206.

Figure 2F:
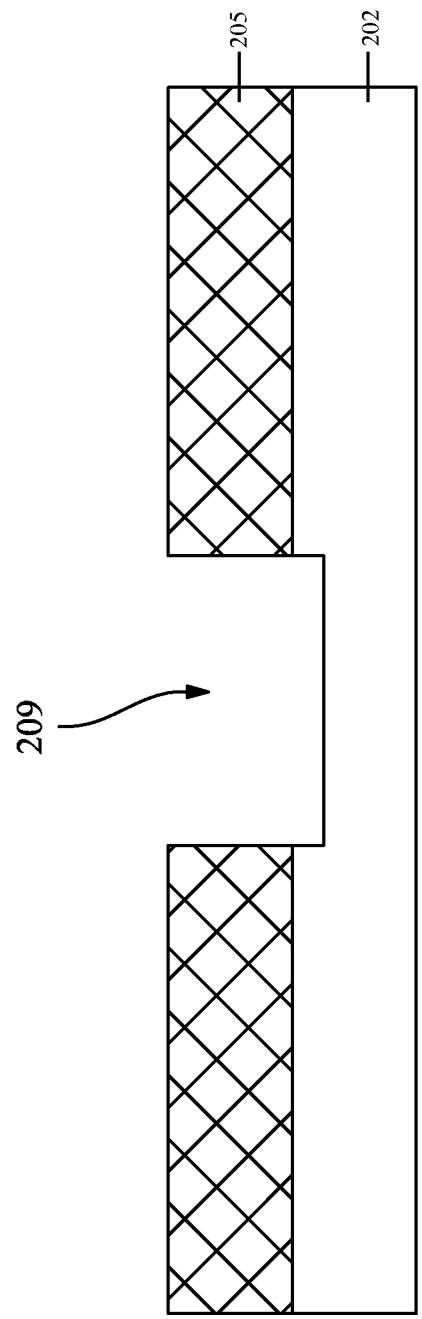
Figure 2G:
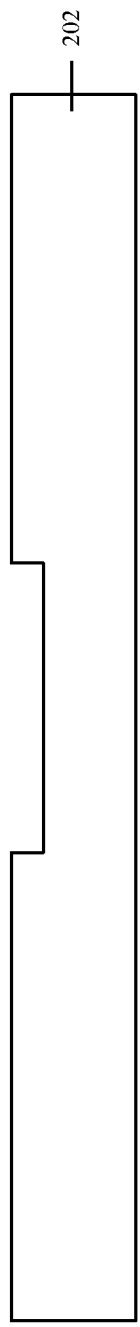

Referring still to FIG. 1, the method 100 continues to operation 112 with treating the cross-linked layer 205 (209 as illustrated in FIG. 2F) so as to diminish the increased molecular weight. The treating 209 may include exposing the cross-linked layer 205 to a radiation source. In accordance with various embodiments, the radiation source may be an ultraviolet (UV) light source. The present embodiments provide various methods to de-crosslink a cross-linked layer by using a treating process (e.g., the UV curing process described herein). Various advantages may be provided while the cross-linked layer is de-crosslinked. The cross-linked layer is intended to serve as a protective layer over the overlaid substrate. However, such a cross-linked layer is hard to be removed due to its high molecular weight. Accordingly, conventional approaches generally use a relatively strong etching process (e.g., a plasma etching process) and/or strong solution to remove the cross-linked layer, which may, in turn, cause damage to the substrate. In contrast, the current disclosure circumvents using the conventional approaches to remove the cross-linker layer by de-crosslinking the cross-linked layer before removing it. FIGS. 3A and 3B, FIGS. 4A and 4B, and FIGS. 5A and 5B respectively show a schematic example of how a cross-linked layer transitions into a de-crosslinked layer in response to a treatment (e.g., the UV curing treatment 209).

Referring now to FIG. 3A, in some embodiments, the cross-linked layer 205 may include a first polymer chain (including a polymer backbone 302), a second polymer chain (including a polymer backbone 304), a photo-cleavable functional group 306, and a cross-linker 308. As illustrated in FIG. 3A, the two polymer chains may be linked/connected/cross-linked via the cross-linker(s) 308, and the photo-cleavable functional group 306 is embedded in the polymer backbones 302 and 304. More specifically, the photo-cleavable functional group 306 provides a photo-cleavable bond 306a to connect itself to an atom of the polymer backbone 302 and another photo-cleavable bond 306b to connect itself to another atom of the polymer backbone 302. Similarly, there may be more than one photo-cleavable functional group configured to connect any of two atoms of a particular polymer backbone. Such a photo-cleavable functional group 306 may disconnect the bonds (e.g., 306a and 306b) in response to a radiation (e.g., the UV curing treatment 209). For example, after the cross-linked layer 205 is treated (209), the photo-cleavable functional group 306 may disconnect its bonds to the atoms of the polymer backbone and thus the polymer backbone may be broken into a plurality of segments. As illustrated in FIG. 3B, after the photo-cleavable functional group 306 disconnects its bonds to the atoms of the polymer backbone, segments 310, 312, and 314 are provided. A layer that includes such segments may be referred to as a "de-crosslinked" layer hereinafter. The de-crosslinked layer may in turn include a lower molecular weight compared to the larger molecular weight of the cross-linked layer.

Referring now to FIG. 4A, in some embodiments, the cross-linked layer 205 may include a first polymer chain (including a polymer backbone 402), a second polymer chain (including a polymer backbone 404), and a photo-cleavable cross-linker 406. As illustrated in FIG. 4A, the two polymer chains may be linked/connected/cross-linked via the photo-cleavable cross-linker(s) 406. More specifically, the photo-cleavable cross-linker 406 provides a photo-cleavable bond 406a to connect itself to an atom of the polymer backbone 402 and another photo-cleavable bond 406b to connect itself to an atom of the polymer backbone 404. Similarly, there may be more than one photo-cleavable cross-linker configured to connect any of two polymer backbones. Such a photo-cleavable cross-linker 406 may disconnect the bonds (e.g., 406a and 406b) in response to a radiation (e.g., the UV curing treatment 209). For example, after the cross-linked layer 205 is treated (209), the photo-cleavable cross-linker 406 may disconnect its bonds to each atom of the two polymer backbones and thus the two polymer backbones may be disconnected/de-crosslinked. As illustrated in FIG. 4B, after the photo-cleavable cross-linker 406 disconnects its bonds to the atoms of the two polymer backbones 402 and 404, the polymer backbones 410 and 412 are disconnected. In some embodiments, the polymer backbone 410 may be similar to or different from the polymer backbone 402; the polymer backbone 414 may be similar to or different from the polymer backbone 404. In some embodiments, a layer that includes such disconnected polymer backbones may also be referred to as a "de-crosslinked" layer. The de-crosslinked layer may in turn include a lower molecular weight compared to the larger molecular weight of the cross-linked layer.

Figures 5A, 5B:
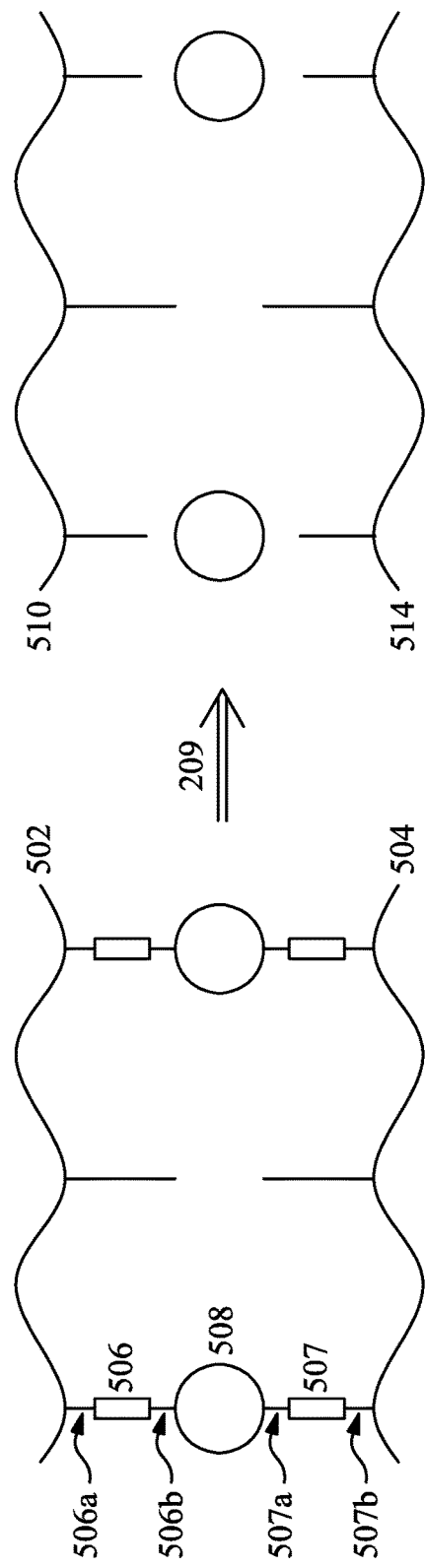
FIGS. 5A and 5B respectively illustrates a schematic example of a crosslinked layer and a de-crosslinked layer in response to a treatment, constructed according to aspects of the present disclosure in some embodiments.

Referring now to FIG. 5A, in some embodiments, the cross-linked layer 205 may include a first polymer chain (including a polymer backbone 502), a second polymer chain (including a polymer backbone 504), a photo-cleavable functional group 506, and a cross-linker 508. As illustrated in FIG. 5A, the two polymer chains may be linked/connected/cross-linked via the cross-linker(s) 508, and further each cross-linker 508 connects itself to two polymer backbones 502 and 504 via two photo-cleavable functional groups 506. More specifically, one of the two photo-cleavable functional group 506 provides a photo-cleavable bond 506a to connect itself to an atom of the polymer backbone 502 and another photo-cleavable bond 506b to connect itself to the cross-linker 508. Similarly, another of the two photo-cleavable functional group 507 connects itself to the cross-linker 508 and another polymer backbone 504 via two photo-cleavable bonds 507a and 507b. Such photo-cleavable functional groups 506 and 507 may disconnect the bonds (e.g., 506a, 506b, 507a, and 507b) in response to a radiation (e.g., the UV curing treatment 209). For example, after the cross-linked layer 205 is treated (209), the photo-cleavable functional group 506 may disconnect its bonds 506a and 506b. Also, the photo-cleavable functional group 507 may disconnect its bonds 507a and 507b. Thus, as illustrated in FIG. 5B, the two polymer backbones may be disconnected/de-crosslinked. As illustrated in FIG. 4B, after the photo-cleavable bonds 506a, 506b, 507a, and 507b are broken, the polymer backbones 510 and 512 are disconnected. In some embodiments, the polymer backbone 510 may be similar to or different from the polymer backbone 502; the polymer backbone 514 may be similar to or different from the polymer backbone 504. In some embodiments, a layer that includes such disconnected polymer backbones may also be referred to as a "de-crosslinked" layer. The de-crosslinked layer may in turn include a lower molecular weight compared to the larger molecular weight of the cross-linked layer.

Referring back to FIGS. 1 and 2G, the method 100 continues to operation 114 with removing the de-crosslinked layer 205 by using a solution that does not damage the substrate 202. In some embodiments, such a removal process may include applying a mild solution on the substrate 202, whereby the solution includes an organic solvent and/or an aqueous solution. The organic solvent includes: dimethyl sulfoxide (DMSO), tetrahydrofuran (THF), propylene glycol methyl ether (PGME), propylene glycol methyl ether acetate (PGMEA), ethanol, propanol, butanol, methanol, ethylene glycol, gamabutylactone, N-Methyl-2-pyrrolidone (NMP), alkylsulfoxide; carboxylic ester, carboxylic acid, alcohol, glycol, aldehyde, ketone, acid anhydride, lactone, halogenated alkane, non-halogenated alkane, branched alkane, non-branched alkane, cyclic alkane, non-cyclic alkane, saturated alkane, non-saturated alkane, or a combination thereof; the aqueous solution includes: hydrogen chloride (HCl), sulfuric acid ($H_2SO_4$), nitric acid ($HNO_3$), hydrogen fluoride (HF), phosphoric acid, tetramethylammonium hydroxide (TMAH), hydrogen peroxide ($H_2O_2$), ozone ($O_3$), poly alkyoxide, fluoroalkyl salt, ethylenediamine, ethylenediaminetetraacetic acid (EDTA), dimercaprol, or a combination thereof. Further, while applying the solution on the substrate to remove the de-crosslinked layer 205, one or more conditions listed below may be used: an operation temperature ranging from about room temperature to 150° C. and an operation pressure ranging between about 0.9 atm to 10 atm. The above-mentioned solution (either the organic solution, inorganic solution, the aqueous solution, or the combination hereof) is considered as a mild solution in the art and thus anyone knows the art should acknowledge that such mild solution should not cause damage to the substrate.

The present disclosure provides various embodiments of a method to form a cross-linkable layer that may simultaneously protect an overlaid substrate/layer and is not subject to cause damage to the overlaid substrate/layer while being removed. In an embodiment, a method includes forming a crosslinked layer over a substrate, treating the crosslinked layer by using a radiation source thereby reducing a molecular weight of the crosslinked layer, and removing the crosslinked layer with the reduced molecular weight by using a solution.

In another embodiment, a method includes forming a crosslinked layer over a substrate, forming a patterned layer over the crosslinked layer, patterning the crosslinked layer and the substrate by using the patterned layer as a mask, treating the crosslinked layer by using a radiation source thereby reducing a molecular weight of the crosslinked layer, and removing the crosslinked layer with the reduced molecular weight by using a solution.

Yet in another embodiment, a method includes providing a substrate, forming a crosslinked layer over the substrate, wherein the crosslinked layer is in contact with the substrate, forming a patterned layer over the crosslinked layer, forming a pattern in the crosslinked layer and further in the substrate by using the patterned layer as a mask, treating the crosslinked layer by using a radiation source to transition the crosslinked layer to a de-crosslinked layer with a reduced molecular weight, and removing the de-crosslinked layer by using a solution that is not subject to cause damage on the substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   forming a crosslinked layer over a substrate;
   patterning the crosslinked layer such that crosslink layer defines an opening that exposes a portion of the substrate;
   after patterning the crosslinked layer, treating the patterned crosslinked layer by using a radiation source to form a de-crosslinked layer with a molecular weight that is less than that of the crosslinked layer; and
   removing the de-crosslinked layer by using a solution.

2. The method of claim 1, further comprising:
   forming a patterned layer over the crosslinked layer, and
   wherein patterning the crosslinked layer includes using the patterned layer as a mask.

3. The method of claim 1, wherein the crosslinked layer includes at least two polymer backbones that are connected via at least one of a cross-linker and a photo-cleavable cross-linker.

4. The method of claim 3, wherein each of the at least two polymer backbones includes a photo-cleavable functional group that is configured to break the associated polymer backbone in response to the radiation source.

5. The method of claim 3, wherein the crosslinked layer further includes a photo-cleavable functional group that connects a side chain of one of the polymer backbones to the cross-linker, and wherein the photo-cleavable functional group is configured to break the connection between the side chain of one of the polymer backbones and the cross-linker in response to the radiation source.

6. The method of claim 3, wherein the photo-cleavable cross-linker is configured to break the connection between the at least two polymer backbones.

7. The method of claim 1, wherein the solution includes at least one of dimethyl sulfoxide (DMSO), tetrahydrofuran (THF), propylene glycol methyl ether (PGME), propylene glycol methyl ether acetate (PGMEA), ethanol, propanol, butanol, methanol, ethylene glycol, gamabutylactone, N-Methyl-2-pyrrolidone (NMP), or a combination thereof.

8. The method of claim 1, wherein the solution includes at least one of hydrogen chloride (HCl), sulfuric acid ($H_2SO_4$), nitric acid ($HNO_3$), hydrogen fluoride (HF), phosphoric acid, tetramethylammonium hydroxide (TMAH), hydrogen peroxide ($H_2O_2$), ozone ($O_3$), poly alkyoxide, fluoroalkyl salt, ethylenediamine, ethylenediaminetetraacetic acid (EDTA), dimercaprol, or a combination thereof.

9. The method of claim 1, wherein the solution is applied to the de-crosslinked layer at temperature ranging between about room temperature to about 150° C. and pressure ranging between about 0.9 atm to about 10 atm.

10. A method comprising:
    forming a crosslinked layer over a substrate;
    forming a patterned layer over the crosslinked layer;
    patterning the crosslinked layer and the substrate by using the patterned layer as a mask;
    after patterning the crosslinked layer and the substrate by using the patterned layer as the mask, treating the crosslinked layer by using a radiation source to form a de-crosslinked layer; and
    removing the de-crosslinked layer by using a solution.

11. The method of claim 10, wherein the crosslinked layer includes at least two polymer backbones that are connected via at least one of a cross-linker and a photo-cleavable cross-linker.

12. The method of claim 11, wherein each of the at least two polymer backbones includes a photo-cleavable functional group that is configured to break the associated polymer backbone in response to the radiation source.

13. The method of claim 11, wherein the crosslinked layer further includes a photo-cleavable functional group that connects a side chain of one of the polymer backbones to the cross-linker, and wherein the photo-cleavable functional group is configured to break the connection between the side chain of one of the polymer backbones and the cross-linker in response to the radiation source.

14. The method of claim 11, wherein the photo-cleavable cross-linker is configured to break the connection between the least two polymer backbones.

15. The method of claim 10, wherein the solution includes at least one of dimethyl sulfoxide (DMSO), tetrahydrofuran (THF), propylene glycol methyl ether (PGME), propylene glycol methyl ether acetate (PGMEA), ethanol, propanol, butanol, methanol, ethylene glycol, gamabutylactone, N-Methyl-2-pyrrolidone (NMP), or a combination thereof.

16. The method of claim 10, wherein the solution includes at least one of hydrogen chloride (HCl), sulfuric acid ($H_2SO_4$), nitric acid ($HNO_3$), hydrogen fluoride (HF), phosphoric acid, tetramethylammonium hydroxide (TMAH), hydrogen peroxide ($H_2O_2$), ozone ($O_3$), poly alkyoxide, fluoroalkyl salt, ethylenediamine, ethylenediaminetetraacetic acid (EDTA), dimercaprol, or a combination thereof.

17. The method of claim 10, wherein the solution is applied to the de-crosslinked layer at temperature ranging between about room temperature to about 150° C. and pressure ranging between about 0.9 atm to about 10 atm.

18. A method comprising:
providing a substrate;
forming a crosslinked layer over the substrate, wherein the crosslinked layer is in contact with the substrate;
forming a patterned layer over the crosslinked layer;
forming a pattern in the crosslinked layer and further in the substrate by using the patterned layer as a mask;
after forming the pattern in the crosslinked layer and further in the substrate by using the patterned layer as the mask, treating the crosslinked layer by using a radiation source to transition the crosslinked layer to a de-crosslinked layer with a reduced molecular weight; and
removing the de-crosslinked layer by using a solution.

19. The method of claim 18, wherein the solution includes at least one of dimethyl sulfoxide (DMSO), tetrahydrofuran (THF), propylene glycol methyl ether (PGME), propylene glycol methyl ether acetate (PGMEA), ethanol, propanol, butanol, methanol, ethylene glycol, gamabutylactone, N-Methyl-2-pyrrolidone (NMP), or a combination thereof.

20. The method of claim 18, wherein the solution includes at least one of hydrogen chloride (HCl), sulfuric acid (H2SO4), nitric acid (HNO3), hydrogen fluoride (HF), phosphoric acid, tetramethylammonium hydroxide (TMAH), hydrogen peroxide (H2O2), ozone (O3), poly alkyoxide, fluoroalkyl salt, ethylenediamine, ethylenediaminetetraacetic acid (EDTA), dimercaprol, or a combination thereof.

* * * * *